United States Patent [19]

Hart

[11] Patent Number: 5,089,347
[45] Date of Patent: Feb. 18, 1992

[54] METALLIZED COMPOSITE POLYMER FILMS

[75] Inventor: Charles R. Hart, Yarm, England

[73] Assignee: Imperial Chemical Industries PLC, London, England

[21] Appl. No.: 382,221

[22] Filed: Jul. 20, 1989

[30] Foreign Application Priority Data

Jul. 25, 1988 [GB] United Kingdom ............... 8817664

[51] Int. Cl.$^5$ .................... B32B 15/08; B32B 27/36; B05D 1/36
[52] U.S. Cl. .................... 428/461; 427/250; 427/294; 427/296; 427/402; 428/480; 428/483
[58] Field of Search ............ 428/462, 461, 480, 483; 427/402, 296, 294, 250

[56] References Cited

U.S. PATENT DOCUMENTS

| | | |
|---|---|---|
| 3,746,606 | 7/1973 | Chao .................. 156/334 |
| 4,016,305 | 4/1977 | Wakabayashi et al. ........ 427/296 X |
| 4,457,977 | 7/1984 | Walles .................. 428/461 X |
| 4,619,972 | 10/1986 | Inoue et al. .............. 428/462 X |
| 4,933,228 | 6/1990 | Katagiri et al. ............ 428/462 X |

FOREIGN PATENT DOCUMENTS 0027375 4/1981 European Pat. Off. .
1306944 2/1973 United Kingdom .

Primary Examiner—Thomas J. Herbert, Jr.
Attorney, Agent, or Firm—Cushman, Darby & Cushman

[57] ABSTRACT

A metallized film has a substrate layer of a synthetic polymeric material having, on at least one surface thereof, an adherent layer comprising a homopolymer and/or copolymer comprising styrene and/or a styrene derivative, the copolymer comprising at least one or more other ethylenically unsaturated comonomer which is copolymerizable with the styrene and/or styrene derivative. A metallic layer is on the surface of the at least one adherent layer, remote from the substrate.

9 Claims, 1 Drawing Sheet

METALLIZED COMPOSITE POLYMER FILMS

This invention relates to a metallised film and, in particular, to a metallised film comprising a primed polymeric substrate.

Metallic foils, such as aluminium foil, which hitherto have been employed as packaging materials for snack foods, bakery products, potato crisps, coffee beans etc, are increasingly being replaced by less costly metallised film composite structures comprising a substrate of a polymeric film coated with a thin metallic layer. The polymeric film substrate generally provides a strong, flexible packaging medium offering desirable oxygen and moisture barrier properties, and these characteristics are supplemented by the presence of the metallic layer which additionally provides a barrier to visible and ultra-violet light thereby delaying the onset of oxidative degradation to which certain packaged products are vulnerable.

To promote adhesion between a polymeric film and a subsequently deposited metallic layer it is advantageous to employ an intermediate priming layer. Even so, available metallised films are prone to rupture by failure of the adhesive bond between the substrate and metallic layer, particularly if a film package is exposed to impacts, or otherwise mishandled—for example, by being accidentally dropped onto a relatively solid surface.

We have now devised a metallised film exhibiting improved adhesion between the substrate and metallic layer.

Accordingly, the present invention provides a metallised film comprising a substrate layer of a synthetic polymeric material having on at least one surface thereof an adherent layer and a metallic layer on the surface of the at least one adherent layer remote from the substrate, wherein the adherent layer comprises a homopolymer and/or copolymer comprising styrene and/or a styrene derivative, the copolymer comprising at least one other ethylenically unsaturated comonomer which is copolymerisable with the styrene and/or styrene derivative.

The invention also provides a method of producing a metallised film by forming a substrate layer of a synthetic polymeric material, applying to at least one surface thereof an adherent layer, and depositing a metallic layer on the surface of the at least one adherent layer remote from the substrate, wherein the adherent layer comprises a homopolymer and/or copolymer comprising styrene and/or a styrene derivative, the copolymer comprising at least one other ethyleneically unsaturated comonomer which is copolymerisable with the styrene and/or styrene derivative.

The styrene and/or styrene derivative homopolymers and copolymers which are used in the adherent layer according to this invention are generally water-soluble.

Styrene derivatives suitable for the production of the adherent polymer preferably comprise chloro styrene, hydroxy styrene and alkylated styrenes, wherein the alkyl group contains from one to ten carbon atoms.

Generally, the molar proportion of the styrene and/or styrene derivative monomer should preferably exceed 25 mole % of the copolymer.

It has been found that a satisfactory combination of properties may be obtained for copolymers derived from only two monomers when the styrene and/or styrene derivative is present in a preferred proportion within the range 60 to 90 mole %. Satisfactory properties are provided by terpolymers comprising styrene and/or a styrene derivative in the range 35 to 90 mole %.

Styrene derivative comonomers may be employed to provide special copolymer properties. For example sulphonated styrene derivatives provide anti-static properties. Such copolymers may comprise other non-sulphonated styrene and/or styrene derivatives within the effective range specified above.

Copolymers of styrene and/or styrene derivatives may comprise one or more other ethylenically unsaturated comonomers which are copolymerisable therewith. Suitable comonomers may be selected from $\alpha\beta$-unsaturated carboxylic acids, such as acrylic and methacrylic acids and their esters and amides, including alkyl esters in which the alkyl group contains up to ten carbon atoms e.g. methyl, ethyl, propyl, isopropyl, butyl, hexyl, heptyl, n-octyl and 2-ethylhexyl groups, butadiene, acrylonitrile, vinyl esters, such as vinyl acetate, vinyl chloroacetate, vinyl benzoate, vinyl pyridine and vinyl chloride, vinylidene chloride, maleic acid and anhydride and itaconic acid and anhydride. The preferred copolymers may be formed with butadiene, butyl acrylate and/or itaconic acid. Copolymers comprising at least 50, preferably 60, mole % of styrene are especially useful.

Conventional additives may be included in the adherent layer, e.g. adhesion promoters, such as a partially hydrolysed vinyl acetate/vinyl chloride copolymer optionally admised with a chlorinated phenol, slip and anti-static agents.

The adherent layer may be applied by conventional techniques as a dispersion or solution in a suitable solvent. If desired, the adherent dispersion or solution may contain a cross-linking agent which functions to cross-link the adherent polymer thereby improving adhesion to the plastics film. Additionally, the cross-linking agent should preferably be capable of internal cross-linking in order to provide protection against solvent penetration. Suitable cross-linking components may comprise epoxy resins, alkyd resins, amine derivatives such as hexamethoxymethyl melamine, and/or condensation products of an amine, e.g. melamine, diazine, urea, cyclic ethylene urea, cyclic propylene urea, thiourea, cyclic ethylene thiourea, alkyl melamines, aryl melamines, benzo guanamines, guanamines, alkyl guanamines and aryl guanamines with an aldehyde e.g. formaldehyde. A useful condensation product is that of melamine with formaldehyde. The condensation product may optionally be alkoxylated. The cross-linking agent may be used in amounts of up to 25% by weight based on the weight of the polymer in the adherent composition.

A catalyst is also preferably employed to facilitate cross-linking. Preferred catalysts for cross-linking melamine formaldehyde include ammonium chloride, ammonium nitrate, ammonium thiocyanate, ammonium dihydrogen phosphate, ammonium sulphate, diammonium hydrogen phosphate, para toluene sulphonic acid, maleic acid stabilised by reaction with a base, and morpholinium para toluene sulphonate.

The substrate of a metallised film according to the invention may be formed from any synthetic, film-forming polymeric material. Suitable thermoplastics materials include a homopolymer or copolymer of a 1-olefin, such as ethylene, propylene and butene-1, a polyamide, a polycarbonate, and, particularly, a synthetic linear polyester which may be obtained by condensing one or more dicarboxylic acids or their lower alkyl (up to 6 carbon atoms) diesters, e.g. terephthalic acid, isophthalic acid, phthalic acid, 2,5-, 2,6- or 2,7-naphthalenedicarboxylic acid, succinic acid, sebacic acid, adipic acid, azelaic acid, 4,4′-diphenyldicarboxylic acid, hexahydroterephthalic acid or 1,2-bis-p-carboxyphenoxyethane (optionally with a monocarboxylic acid, such as pivalic acid) with one or more glycols, e.g. ethylene glycol, 1,3-propanediol, 1,4-butanediol, neopentyl glycol and 1,4-cyclohexanedimethanol. A polyethylene terephthalate film is particularly preferred, especially such a film which has been biaxially oriented by sequential stretching in two mutually perpendicular directions, typically at a temperature in the range 70° to 125° C., and preferably heat set, typically at a temperature in the range 150° to 250° C., for example-as described in British patent 838 708.

The substrate may also comprise a polyarylether or thio analogue thereof, particularly a polyaryletherketone, polyarylethersulphone, polyaryletheretherketone, polyaryletherethersulphone, or a copolymer or thioanalogue thereof. Examples of these polymers are disclosed in EP-A-1879, EP-A-184458 and U.S. Pat. No. 4,008,203, particularly suitable materials being those sold by ICI Chemical and Polymers Ltd under the Registered Trade Mark STABAR. Blends of these polymers may also be employed.

Suitable thermoset resin substrate materials include addition—polymerisation resins—such as acrylics, vinyls, bis-maleimides and unsaturated polyesters, formaldehyde condensate resins—such as condensates with urea, melamine or phenols, cyanate resins, isocyanate resins, epoxy resins, functionalised polyesters, polyamides or polyimides.

A polymeric film substrate for production of a metallised film according to the invention may be unoriented, or uniaxially oriented, but is preferably biaxially oriented by drawing in two mutually perpendicular directions in the plane of the film to achieve a satisfactory combination of mechanical and physical properties.

Simultaneous biaxial orientation may be effected by extruding a thermoplastics polymeric tube which is subsequently quenched, reheated and then expanded by internal gas pressure to induce longitudinal orientation. In such a simultaneous stretching process, the adherent coating medium is suitably applied to the substrate either before commencement or after conclusion of the stretching operation. Sequential stretching may be effected in a stenter process by extruding the thermoplastics substrate material as a flat extrudate which is subsequently stretched first in one direction and then in the other mutually perpendicular direction. Generally, it is preferred to stretch firstly in the longitudinal direction, i.e. the forward direction through the film stretching machine, and then in the transverse direction. A stretched substrate film may be, and preferably is, dimensionally stabilised by heat-setting under dimensional restraint at a temperature above the glass transition temperature of the film-forming polymer but below the melting temperature thereof.

The adherent coating medium may be applied to an already oriented film substrate. However, application of the coating medium is preferably effected before or during the stretching operation.

In particular, it is preferred that the adherent coating medium should be applied to the film substrate between the two stages (longitudinal and transverse) of a biaxial stretching operation. Such a sequence of stretching and coating is especially preferred for the production of a coated linear polyester film substrate, such as a coated polyethylene terephthalate film, which is preferably firstly stretched in the longitudinal direction over a series of rotating rollers, coated with the adherent layer and then stretched transversely in a stenter oven, preferably followed by heat setting.

The adherent layer is preferably applied as an aqueous dispersion in such an operation. It has been found that adhesion of homopolymers of styrene applied to polyethylene terephthalate films by such a process may be improved by including a cross-linking agent in the adherent composition.

The procedure for applying the adherent composition may be any of the known coating techniques, such as dip coating, bead coating, reverse roller coating or slot coating.

Alternatively, the plastics film and the adherent layer may be formed by coextrusion or they may be formed by independent operations and then laminated.

Modification of the surface of the adherent layer e.g. by flame treatment, ion bombardment, electron beam treatment of preferably by corona discharge, may improve the adhesion of the metallised layer applied directly to the polymeric adherent layer but may not be essential to the provision of satisfactory adhesion.

The preferred treatment by corona discharge may be effected in air at atmospheric pressure with conventional equipment using a high frequency, high voltage generator, preferably having a power output of from 1 to 20 kw at a potential of 1 to 100 kv. Discharge is conveniently accomplished by passing the film over a dielectric support roller at the discharge station at a linear speed preferably of 1.0 to 500 m per minute. The discharge electrodes may be positioned 0.1 to 10.0 mm from the moving film surface. The applied adherent layer should preferably exhibit a wetting test value after corona discharge treatment exceeding 56 dynescm$^{-1}$ when measured by the Union Carbide Standard Wetting Test (WC 81-3/1964) with formamide/'Cellosolve' mixture, whereas the value exhibited by an untreated layer is generally in the range 34 to 38 dynescm$^{-1}$. In this test, liquid mixtures having a range of surface tensions are made up using various concentrates of formamide in 'Cellosolve' (2-ethoxy ethanol) and brushed onto the surface to be examined. The wetting test value is the surface tension of the liquid mixture having the highest surface tension which does not contract into droplets within two seconds after application onto the surface.

Adherent layers having a coat weight in the range 0.1 to 10 mgdm$^{-2}$ provide satisfactory adhesion. Coat weights in the range 0.5 to 3.0 mgdm$^{-2}$ are preferred.

Prior to deposition of the adherent layer onto the polymeric substrate the exposed surface thereof may, if desired, be subjected to a chemical or physical surface-modifying treatment to improve the bond between that surface and the subsequently applied adherent polymer. A preferred treatment, because of its simplicity and effectiveness, which is particularly suitable for the treatment of a polyolefin substrate, is to subject the exposed surface of the substrate to a high voltage electrical stress accompanied by corona discharge. Alternatively, the substrate may be pretreated with an agent known in the art to have a solvent or swelling action on the substrate polymer. Examples of such agents, which are particularly suitable for the treatment of a polyester substrate, include a halogenated phenol dissolved in a common organic solvent e.g. a solution of p-chloro-m-cresol, 2,4-dichlorophenol, 2,4,5- or 2,4,6-trichlorophenol or 4-chlororesorcinol in acetone or methanol.

Alternatively, the polymeric substrate may carry an adhesion-promoting polymeric layer to which the layer containing the polymeric component may be applied.

An adherent coating may be applied to one or each surface of the polymeric substrate, and one or each adherent layer may be subsequently metallised. Alternatively, one surface of the substrate may be uncoated, or may be coated with a layer of a material other than the herein specified homopolymer and/or copolymer comprising styrene and/or styrene derivative. For example, a pressure sensitive adhesive layer may be deposited on the unmetallised surface of a substrate.

Deposition of a metallic layer onto the, or each, adherent polyester resin layer may be effected by conventional metallising techniques—for example, by deposition from a suspension of finely-divided metallic particles in a suitable liquid vehicle, or by electron beam evaporation, electroless plating, or preferably, by a vacuum deposition process in which a metal is evaporated onto the adherent resin surface in a chamber maintained under conditions of high vacuum. Suitable metals include palladium, titanium, chromium, nickel, copper (and alloys thereof, such as bronze), silver, gold cobalt and zinc, but aluminium is to be preferred for reasons both of economy and ease of bonding to the resin layer.

Metallising may be effected over the entire exposed surface of the adherent layer or over only selected portions thereof, as desired.

Metallised films in accordance with the present invention may be prepared in a range of thicknesses governed primarily by the ultimate application for which a particular film is to be employed. Films, having a total thickness in a range extending from 2.5 to 250 μm are of general utility, although for packaging applications a packaging film of from about 10 to 50 μm in total thickness is generally suitable.

The ratio of substrate to adherent layer thickness may vary within a wide range, although the thickness of the adherent layer preferably should not be less than 0.004% nor greater than 10% of that of the substrate. In practice, the thickness of the adherent layer is desirably at least 0.01 μm and preferably should not greatly exceed about 1.0 μm. The metallic layer is conveniently deposited in a thickness from monoatomic proportions to about 50 μm or greater, although a preferred range is from 0.005 to 15.0 μm, and particularly from 0.01 to 0.5 μm.

One or more of the polymeric layers of a metallised film according to the invention may conveniently contain any of the additives conventionally employed in the manufacture of thermoplastics polymeric films. Thus, agents such as dyes, pigments, voiding agents, lubricants, anti-oxidants, anti-blocking agents, surface active agents, slip aids, gloss-improvers, prodegradants, ultraviolet light stabilisers, viscosity modifiers and dispersion stabilisers may be incorporated in the substrate and/or adherent layer(s), as appropriate. In particular an adherent layer, and/or a substrate, may comprise a particulate filler, such as silica, of small particle size. Desirably, a filler, if employed in an adherent layer, should be present in an amount not exceeding 50% by weight of the adherent layer, and the particle size thereof should not exceed 0.5 μm, preferably less than 0.3 μm, and especially from 0.005 to 0.2 μm. A filler, if employed in a substrate layer, should be present in a small amount, not exceeding 0.5%, preferably less than 0.2%, by weight of the substrate. The haze characteristics of a polymeric film containing a filler of large particle size are such that a metallised film prepared therefrom exhibits an undesirable dull appearance.

The adherent layers applied according to this invention to polyethylene terephthalate films are such that the film base is suitable for recycling through the film forming extruder and stretching equipment.

Application of decorative and/or descriptive matter to the films of the invention may be effected by conventional printing techniques, for example-by printing an inked pattern directly onto the metallic surface of the film and, optionally, protecting the printed matter by a layer of a protective layer. Alternatively, reverse printing techniques may be employed whereby the printed matter is embedded in the film at an interlayer position.

Films according to the invention are of utility in a wide range of applications including decorative drapes, reflective screens, mirrors, solar panels, electrical circuit boards, capacitors, magnetic recording media and packaging wraps and pouches. Such films are of particular utility as the internal liner of bag-in-the-box containers for wines, beer and carbonated drinks.

BRIEF DESCRIPTION OF THE DRAWINGS

The invention is illustrated by reference to the accompanying drawings in which:

Referring to FIG. 1 of the drawings, the film comprises a polyester substrate layer (1) having a metallic layer (2) bonded to one surface (3) thereof by an intermediate adherent layer (4) of a homopolymer and/or copolymer comprising styrene and/or a styrene derivative composition according to the invention. Surface (5) of the substrate, remote from metallic layer (2), is uncoated.

Figure 1:
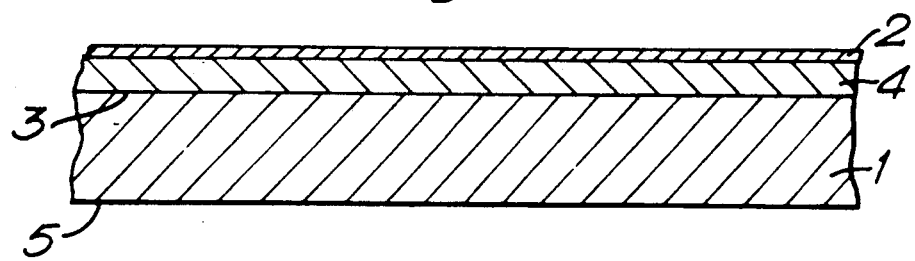
FIG. 1 is a schematic sectional elevation, not to scale, of a polyester film having a single metallic surface layer.
Figure 2:
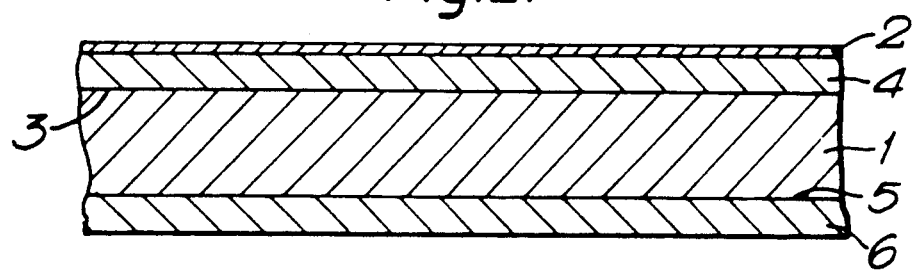
FIG. 2 is a similar schematic elevation of a polyester film having respectively a metallic and an adherent resin surface layer.

The film of FIG. 2 additionally comprises a layer (6) of, for example, an adherent layer bonded to the remote substrate surface (5).

Figure 3:
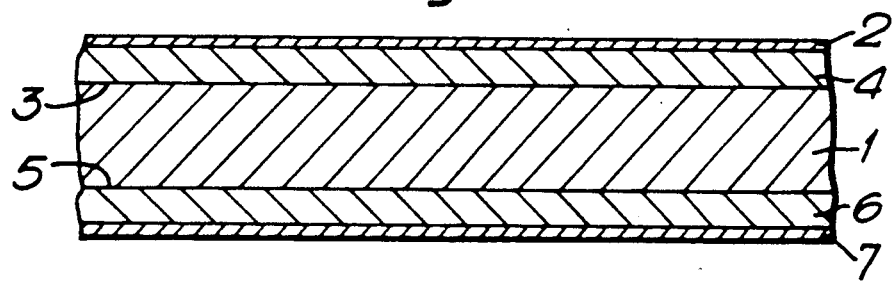
FIG. 3 is a similar schematic elevation of a polyester film metallised on both opposed surfaces.

The film of FIG. 3 further comprises a second metallic layer (7) bonded to a layer (6) of an adherent layer, layer (6) in turn being directly bonded to substrate surface (5).

The invention is further illustrated by reference to the following Examples.

EXAMPLE 1

A copolymer comprising 70/25/5 mole % styrene/butyl acrylate/itaconic acid was synthesised by conventional emulsion copolymerisation. The copolymer was prepared as a 25% by weight aqueous emulsion.

A polyethylene terephthalate film was melt extruded, cast onto a cooled rotating drum and stretched in the direction of extrusion to approximately 3 times its original dimensions. The cooled stretched film was then coated with an aqueous composition containing the following ingredients:

---

Styrene/butyl acrylate/itaconic acid 70/25/5 mole %  10 liters
(25% by weight aqueous emulsion)

-continued

| | |
|---|---|
| Hexamethoxy methyl melamine (commercially available as 'Cymel' 300) | 0.25 Kg |
| Ammonium nitrate | 25 g |
| Water-added to give a coating composition of total volume 25 liters. | |

The polyethylene terephthalate film was coated on one side only.

The coated film was passed into a stenter oven, where the film was dried and stretched in the sideways direction to approximately 3 times its original dimensions. The biaxially stretched coated film was heat set at a temperature of about 200° C. by conventional means. Final film thickness was 12 μm, with a coat weight of approximately 1.5 mgdm$^{-2}$.

The coated side of the film was metallised by a conventional evaporative method to give a layer of aluminium of approximately 500 Å. The metallised film was subjected to a standard peel strength test in order to determine the failure resistance of the laminate. Samples of the metallised film were heat sealed i.e. the metal layer was sealed to a dry adhesive film tape. The seal was achieved using a 'Sentinel' heat-sealer operating at a jaw temperature of 105° C., dwell time of 1 second and jaw pressure of 50 psi (3.45×10$^5$ Nm$^{-2}$). This produced a seal 25 mm wide across the sample.

Peel specimens were prepared by cutting 25 mm wide strips at right angles to the seal, giving a sealed area of 25 mm by 25 mm on each sample, with an unsealed 'tail' at least 100 mm long. Five such specimens were cut from each sealed metallised sample, and the adhesion was measured by peeling apart each specimen using an 'Instron' Tensometer at a peel speed of 200 mm min$^{-1}$. The peel load was recorded for each specimen and the amount of aluminium transferred to the dry adhesive tape was visually assessed in each case. Results are given in Table 1.

EXAMPLE 2

Example 1 was repeated, except that this time when the coated polyethylene terephthalate film emerged from the stenter it was subjected to corona discharge treatment by passing the film through a commercially available 'Vetaphone' 3 Kw treater, with an electrode to film distance of 1 mm.

The corona-treated film was metallised as described in Example 1, and the test results are given in Table 1.

EXAMPLE 3

This is a comparative example not according to the invention. Example 1 was repeated except the polymeric coating stage was omitted. The uncoated polyethylene terephthalate film was metallised as described in Example 1, and the results of the peel strength test are given in Table 1.

TABLE 1

| Example | Peel Strength g/25 mm | (Nm$^{-1}$) | Aluminium removed % |
|---|---|---|---|
| 1 | 850* | (333.4) | 0 |
| 2 | 1100* | (431.5) | 0 |
| 3 | 200 | (78.5) | 90 |

TABLE 1-continued

| Example | Peel Strength g/25 mm (Nm$^{-1}$) | Aluminium removed % |
|---|---|---|
| (Comparative) | | |

*laminate failed due to film breakage. There was no delamination between the metal layer and polymeric coating.

The superior peel strength of, and resistance to removal of aluminium from, metallised films of the present invention is evident from the above results.

I claim:

1. A metallised film comprising a substrate layer of a synthetic polymeric material having on at least one surface thereof an adherent layer and a metallic layer on the surface of the at least one adherent layer remote from the substrate, wherein the adherent layer comprises a homopolymer and/or copolymer comprising styrene and/or a styrene derivative, the copolymer comprising a material selected from the group consisting of acrylic acids, acrylic acid esters, acrylic acid amides, methacrylic acids, methacrylic acid esters, and methacrylic acid amides, copolymerisable with the styrene and/or styrene derivative and not including butadiene.

2. A metallised film as claimed in claim 1 in which the styrene derivative comprises chloro styrene, hydroxy styrene or an alkylated styrene.

3. a metallised film as claimed in either of claims 1 and 2 wherein the adherent layer comprises a copolymer of styrene and/or a styrene derivative.

4. A metallised film as claimed in claim 3, wherein molar proportion of the styrene and/or styrene derivative in the copolymer exceeds 25 mole %.

5. A metallised film as claim 1, 2, 3 or 5 wherein the copolymer is derived from two monomers only and the molar proportion of the styrene and/or styrene derivative in the copolymer is within the range 60 to 90 mole %.

6. A metallised film as claim 1, 2, 3 or 5 wherein the copolymer is a terpolymer and the molar proportion of the styrene and/or styrene derivative in the terpolymer is within the range 35 to 90 mole %.

7. A metallised film as claim 1, 2, 3 or 5 wherein the adherent layer has been at least partially cross-linked.

8. A metallised film as claim 1, 2, 3 or 5 wherein the adherent layer contains a particulate filler having a particle size less than 0.5 μm, and being present in an amount of up to 50% by weight of the adherent layer.

9. A method of producing a metallised film comprising the steps of forming a polyethylene terephthalate film which is biaxially oriented by sequential stretching in two mutually perpendicular directions, the adherent coating medium being applied to the film substrate between the two stages (longitudinal and transverse) of the biaxial stretching, applying to at least one surface thereof an adherent layer, and depositing a metallic layer on the surface of the at least one adherent layer remote from the substrate, wherein the adherent layer comprises a homopolymer and/or copolymer comprising styrene and/or a styrene derivative, the copolymer comprising a material selected from the group consisting of acrylic acids, acrylic acid esters, acrylic acid amides, methacrylic acids, methacrylic acid esters, and methacrylic acid amides, copolymerisable with the styrene and/or styrene derivative and not including butadiene.

* * * * *